US008815615B2

(12) United States Patent
Bei et al.

(10) Patent No.: US 8,815,615 B2
(45) Date of Patent: Aug. 26, 2014

(54) METHOD FOR COPPER HILLOCK REDUCTION

(75) Inventors: Duo Hui Bei, Shanghai (CN); Ming Yuan Liu, Shanghai (CN); Chun Sheng Zheng, Shanghai (CN)

(73) Assignees: Semiconductor Manufacturing International (Shanghai) Corp., Shanghai (CN); Semiconductor Manufacturing International (Beijing) Corp., Beijing (CN)

( * ) Notice: Subject to any disclaimer, the term of this patent is extended or adjusted under 35 U.S.C. 154(b) by 0 days.

(21) Appl. No.: 12/938,158

(22) Filed: Nov. 2, 2010

(65) Prior Publication Data

US 2012/0070915 A1    Mar. 22, 2012

(30) Foreign Application Priority Data

Nov. 10, 2009   (CN) .......................... 2009 1 0198587

(51) Int. Cl.
*G01R 31/26*    (2014.01)

(52) U.S. Cl.
USPC ..................................... 438/14; 257/E21.529

(58) Field of Classification Search
USPC ................................................... 438/14, 937
See application file for complete search history.

(56) References Cited

U.S. PATENT DOCUMENTS

| 6,043,153 | A  | * | 3/2000  | Nogami et al. ............. 438/687 |
| 6,114,253 | A  | * | 9/2000  | Jang et al. ................. 438/725 |
| 6,344,387 | B1 | * | 2/2002  | Hasebe et al. .............. 438/240 |
| 6,518,183 | B1 | * | 2/2003  | Bao et al. .................. 438/687 |
| 6,713,407 | B1 | * | 3/2004  | Cheng et al. ............... 438/775 |
| 6,846,752 | B2 | * | 1/2005  | Chambers et al. ........... 438/771 |
| 7,074,721 | B2 | * | 7/2006  | Wang ......................... 438/706 |
| 7,851,358 | B2 | * | 12/2010 | Wu et al. ................... 438/660 |
| 2003/0183308 | A1 | * | 10/2003 | Yang et al. ................ 148/518 |
| 2004/0033631 | A1 | * | 2/2004  | Clark et al. ................ 438/14 |
| 2004/0198055 | A1 | * | 10/2004 | Wang ......................... 438/692 |
| 2004/0259378 | A1 | * | 12/2004 | Chambers et al. ........... 438/771 |
| 2007/0298568 | A1 | * | 12/2007 | Mokhlesi ..................... 438/257 |

FOREIGN PATENT DOCUMENTS

CN    101005060 A    7/2007

OTHER PUBLICATIONS

Havemann et al., "High-Performance Interconnects: An Integration Overview", Proceedings of the IEEE, vol. 89, No. 5, May 2001, p. 586-601.*

* cited by examiner

*Primary Examiner* — Charles Garber
*Assistant Examiner* — Brigitte Paterson
(74) *Attorney, Agent, or Firm* — Kilpatrick Townsend and Stockton LLP

(57) ABSTRACT

A method of forming interconnects in integrated circuits includes providing a semiconductor substrate and forming a copper interconnect structure that is formed overlying a barrier layer within a thickness of an interlayer dielectric layer. The copper interconnect structure has a first stress characteristic. The method further loads the semiconductor substrate including the copper interconnect structure into a deposition chamber that contains an inert environment. The semiconductor substrate including the copper interconnect structure is annealed in the inert environment for a period of time to cause the copper interconnect structure to have a second stress characteristic. The semiconductor substrate is maintained in the deposition chamber while an etch stop layer is deposited thereon. The method further deposits an intermetal dielectric layer overlying the etch stop layer, wherein the annealing reduces copper hillock defects resulting from at least the first stress characteristic.

16 Claims, 8 Drawing Sheets

1A

1B

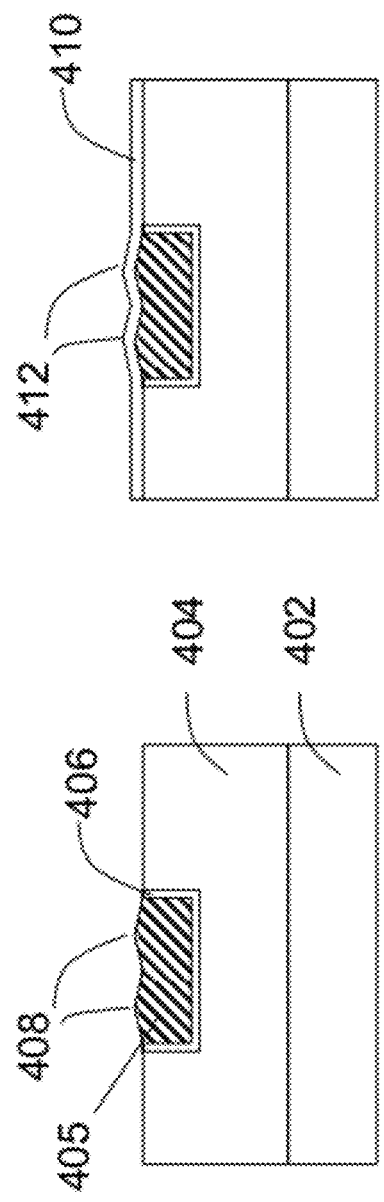
FIG. 3
FIG. 4

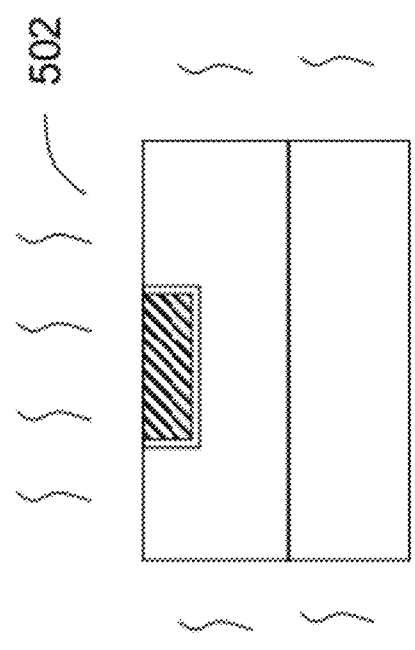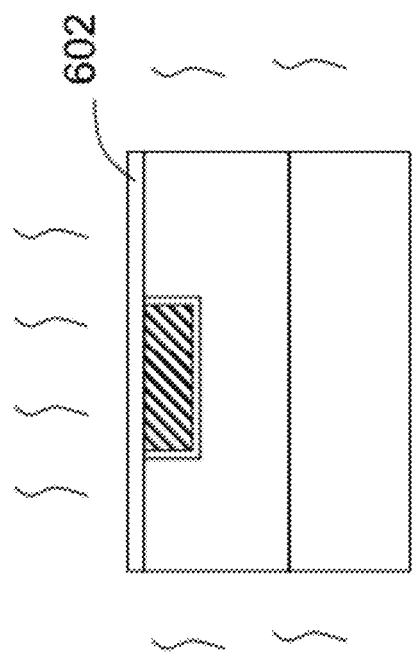
FIG. 5
FIG. 6

METHOD FOR COPPER HILLOCK REDUCTION

CROSS-REFERENCES TO RELATED APPLICATIONS

This application claims priority to Chinese application No. 200910198587.0, filed Nov. 10, 2009, commonly assigned, and incorporated by reference in its entirety herein.

BACKGROUND OF THE INVENTION

Embodiments of the present invention are generally directed to integrated circuit device manufacturing. More particularly, embodiments of the present invention provide a method of forming interconnect structures for integrated circuits. But it would be recognized that the invention has a much broader range of applicability. Certain embodiments of the present invention can be applied to microprocessor devices, memory devices, application specific integrated circuit devices, as well as various other interconnect structures.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs, but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. However, one significant problem that occurs with shrinking figure sizes on an IC is that the conducting portions of an IC such as wire interconnects and transistors often need to be placed closer and closer together, and the insulating dielectrics used to separate the conducting portions also become thinner to accommodate for the reduced size between conducting portions. However, as the transistors are placed in greater proximity to each other, problems in cross-talk noise, power dissipation, RC delay, and others can occur.

One design choice that can help alleviate the problems described above as a result of more tightly packed IC layouts is the use of copper as interconnect wires for the IC. However, the use copper can result in integration difficulties not previously seen.

From the above, it can be seen that an improved technique for processing semiconductor devices is desired.

BRIEF SUMMARY OF THE INVENTION

Embodiments of the present invention are generally directed to integrated circuit (IC) devices and methods of manufacturing integrated circuits. More particularly, embodiments of the present invention provide a method of forming interconnect structures for integrated circuits. But it would be recognized that the invention has a much broader range of applicability. Certain embodiments of the invention can be applied to microprocessor devices, memory devices, application specific integrated circuit devices, as well as various other interconnect structures.

In a specific embodiment, a method for forming interconnects for integrated circuits is provided. The method includes providing a semiconductor substrate having one or more devices provided thereon. The method includes forming a copper interconnect structure overlying a barrier layer within a thickness of an interlayer dielectric layer. In a specific embodiment, the copper interconnect structure comprising a first stress characteristic. The semiconductor substrate including the copper interconnect structure is loaded into a deposition chamber. In a specific embodiment, an inert environment is provided within the deposition chamber. The semiconductor substrate including the copper interconnect structure is subjected to an anneal process in the inert environment for a period of time to cause the copper interconnect structure to have a second stress characteristic. The semiconductor substrate is maintained in the deposition chamber after the anneal process. The method includes depositing a dielectric layer overlying the copper interconnect structure. In a specific embodiment, the dielectric layer comprises an etch stop layer. In a preferred embodiment, the anneal process reduces copper hillock defects resulting from at least the first stress characteristic.

In a specific embodiment, a method for forming interconnects for integrated circuits is provided. The method includes providing a semiconductor substrate having one or more devices provided thereon. The method includes forming a copper interconnect structure overlying a barrier layer within a thickness of an interlayer dielectric layer. In a specific embodiment, the copper interconnect structure comprising a first stress characteristic. The semiconductor substrate including the copper interconnect structure is loaded into a deposition chamber. In a specific embodiment, an inert environment is provided within the deposition chamber. The semiconductor substrate including the copper interconnect structure is subjected to an anneal process in the inert environment for a period of time to cause the copper interconnect structure to have a second stress characteristics. The semiconductor substrate is maintained in the deposition chamber after the anneal process. The method includes depositing a dielectric layer overlying the copper interconnect structure. In a specific embodiment, the dielectric layer comprises an etch stop layer. An inter-metal dielectric layer is then deposited overlying the etch stop layer. In a preferred embodiment, the anneal process reduces copper hillock defects resulting from at least the first stress characteristic.

Many benefits are achieved by ways of the present invention over conventional techniques. For example, the present invention uses an easy to use process and conventional equipments to provide a method to reduce copper hillock defects and improves device yield and performance. Moreover, the present anneal process is performed in a deposition chamber in which a subsequent dielectric layer deposition step is carried out. The substrate does not need to be removed from the deposition chamber in between the anneal step and the dielectric deposition step. Depending on the embodiment, one or more of the benefits may be achieved. These and other benefits will be described in more throughout the present specification and more particularly below.

Various additional embodiments, features and advantages of the present invention can be more fully appreciated with reference to the detailed description and accompanying drawings that follow.

BRIEF DESCRIPTION OF THE DRAWINGS

FIGS. 3-6 are simplified diagrams illustrating a method of fabricating an integrated circuit device according to embodiments of the present invention.

DETAILED DESCRIPTION OF THE INVENTION

The present invention is generally directed to semiconductor integrated circuit processing. More particularly, the present invention provides a method for forming copper interconnect structures that are substantially free of copper hillock defects. But it would be recognized that the invention has a much broader range of applicability. Certain embodiments of the invention can be applied to microprocessor devices, memory devices, application specific integrated circuit devices, as well as various other interconnect structures.

Copper has lower resistivity than conventional metal such as aluminum or tungsten for interconnect structures and is commonly used in high speed devices. Copper interconnects are usually implemented using low k dielectric as intermetal dielectric material. In copper line manufacture, copper hillock is one of the major sources of defects. The formation of copper hillocks may be attributed to stress and thermal budget. The size of copper hillock is usually small and does not affect yield for 0.13 um or greater design node. However, with design node less than 0.09 um, copper hillocks cause defects such as shorts and others and become yield killer defects.

In a specific embodiment, the present invention provides a method for forming an integrated circuit device that may be summarized as follows:

1. Providing a semiconductor substrate, the semiconductor substrate can have one or more devices providing formed thereon.

2. Forming a copper interconnect structure overlying a barrier layer within a thickness of an interlayer dielectric layer, the copper interconnect structure comprises a first stress characteristic.

3. Loading the semiconductor substrate including the copper interconnect structure into a deposition chamber.

4. Providing an inert environment within the deposition chamber.

5. Subjecting the semiconductor substrate including the copper interconnect structure to an anneal process in the inert environment for a period of time to cause the copper interconnect structure to have a second stress characteristic, wherein the anneal process reduces copper hillock defects resulting from at least the first stress characteristic.

6. Maintaining the semiconductor substrate in the deposition chamber; and

7. Depositing a dielectric layer overlying the copper interconnect structure, the dielectric layer being an etch stop layer.

The above sequence of steps provides a method of forming a copper interconnect for a semiconductor device according to an embodiment of the present invention. Depending on the embodiment, one or more steps may be added, one or more steps may be omitted, and one or more steps may be provided in a different sequence without departing from the scope of the present invention. One skilled in the art would recognize other variations, modifications, and alternatives.

Figure 1:
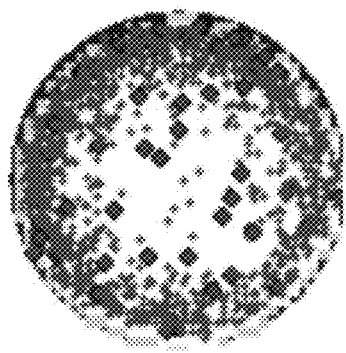
FIG. 1 is a simplified diagram illustrating copper hillock defects according to a conventional fabrication method for the integrated circuit device.
Figure 1:
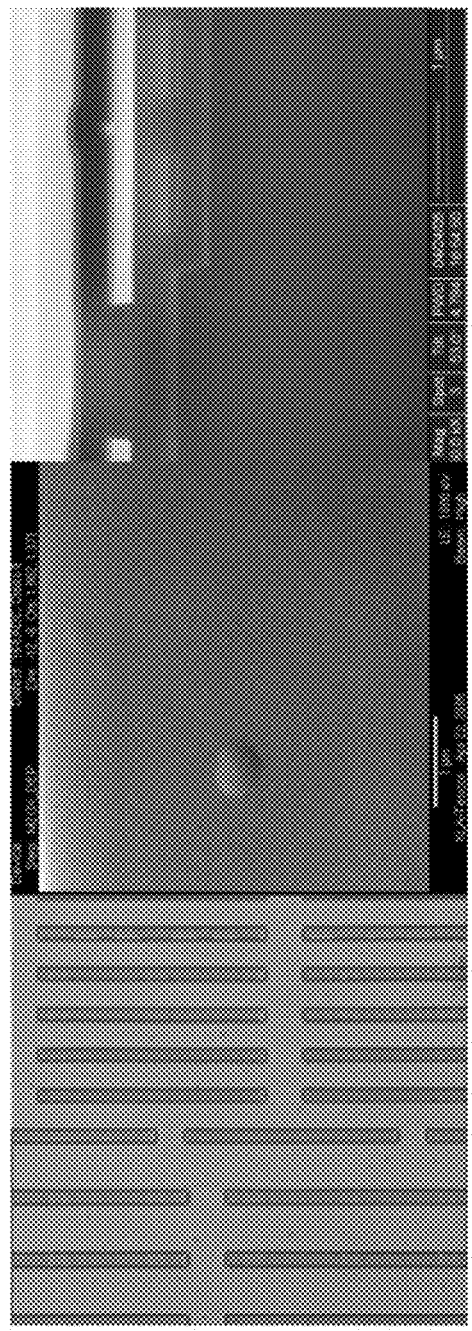

FIGS. 1A and 1B illustrate copper hillock defects according to a conventional fabrication method for an integrated circuit device. Defect map (FIG. 1A) illustrates numerous copper hillock defects on a wafer after intermetal dielectric deposition on copper interconnect. A scanning electron microscope (SEM) picture of a copper hillock defect after intermetal deposition is shown in FIG. 1B. Analysis shows that each of the copper hillock defect has a size ranging from about 0.1 micron to about 0.5 micron. As described, such defects become yield killer for line width less than 90 nm design rule. In addition, the defects, though small in size, are numerous in number and saturate inspection tools and prevent an accurate defect analysis.

Figure 2:
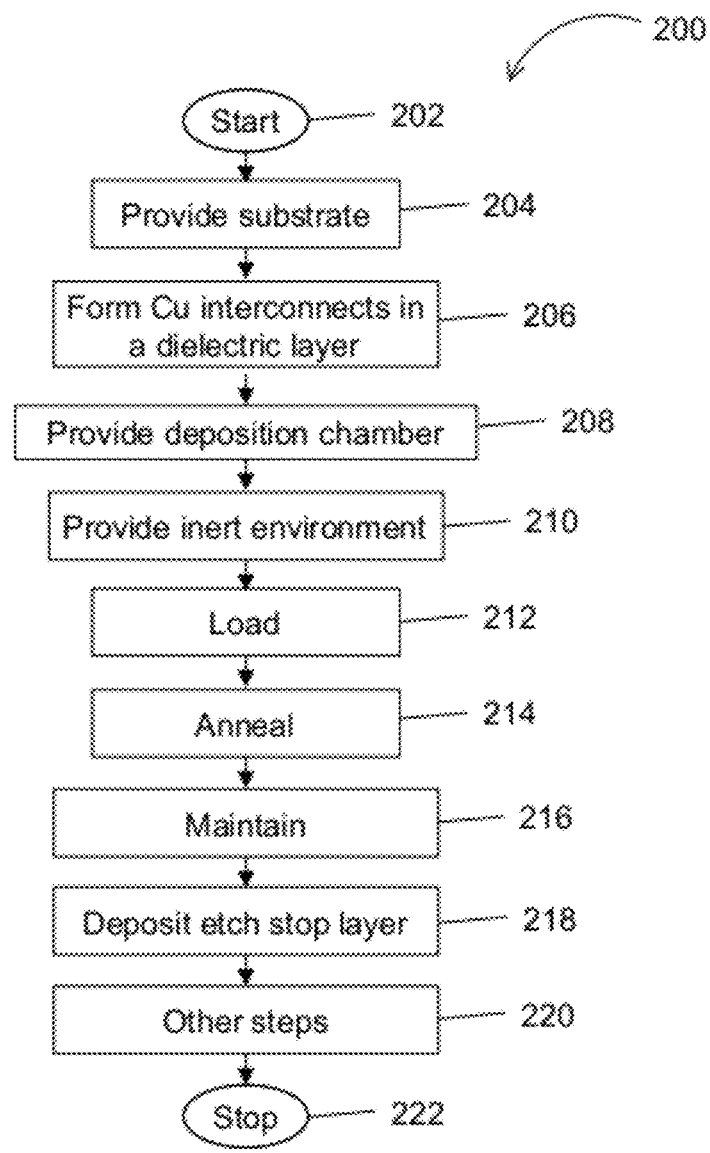
FIG. 2 is a simplified process flow diagram illustrating a method of fabricating an integrated circuit device according to a method of the present invention.

In a specific embodiment, a method to reduce the copper hillock defects is provided as illustrated in a flow diagram 200 in FIG. 2. This diagram is merely an example and should not unduly limit the claims herein. One skilled in the art would recognize other variations, modifications, and alternatives. As shown, the method includes a start step 202. A semiconductor substrate is provided (Step 204). In a specific embodiment, the semiconductor substrate can be a silicon material including single crystal silicon, silicon on insulator (commonly known as SOI), silicon germanium, or other suitable semiconductor material. In a specific embodiment, the semiconductor substrate includes one or more devices formed thereon (not shown).

In a specific embodiment, the present method includes forming a dielectric layer overlying the semiconductor substrate and forming a copper interconnect structure in a portion of the dielectric layer (Step 206). The dielectric layer is formed from a low k dielectric material. The low k dielectric material can include but not limited to silicon oxide material doped with carbon, phosphorus, boron, a combination of these, or a multilayer material depending on the application. Other low k dielectric materials may also include porous silicon oxide materials and others. The copper interconnect structure is usually formed overlying a barrier layer to prevent diffusion of copper material into the dielectric layer. In a specific embodiment, the barrier layer can be a Ta/TaN, Ti/TiN or other suitable barrier materials. In some embodiments, the barrier layer can be a suitable dielectric material. The copper contact structure can be formed using a damascene process or a dual damascene process. Copper is usually deposited using techniques such as chemical vapor deposition, plating (electroplating or electrodeless plating), and a combination thereof. In a specific embodiment, the copper interconnect structure comprises a first stress characteristic. The first stress characteristic causes defects such as copper hillocks, delamination, and the like.

In a specific embodiment, the method includes providing a deposition chamber (Step 208). The deposition chamber can be a chemical vapor deposition (CVD) chamber including a plasma enhanced chemical vapor deposition (PECVD) chamber in a specific embodiment. The method includes providing an inert environment in the deposition chamber (Step 210). The semiconductor substrate including the copper interconnect structure is loaded into the deposition chamber (Step 212), and an anneal process (Step 214) is performed on the copper interconnect structure. The inert environment is provided using nitrogen or an inert gas such as helium, argon, and others. In a specific embodiment, the anneal process is performed at a temperature ranging from about 300 degree Celsius to about 380 degree Celsius and for a time period ranging from about 30 seconds to about 200 seconds in the inert environment. In a specific embodiment, the anneal process is carried out at a pressure ranging from about 2 Torr to about 10 Torr. The pressure is maintained using, for example, Ar at a flow rate of about 2000 SCCM for a pressure of about 5 Torr in a specific embodiment. Of course, there can be other variations, modifications, and alternatives.

In a specific embodiment, the anneal process causes the copper interconnect to have a second stress characteristic. The anneal process reduces the number of copper hillock defects in a preferred embodiment. Further detail can be found throughout the present application and particularly below.

The method maintains the semiconductor substrate in the deposition chamber after the anneal process (Step 216). In a specific embodiment, the method includes depositing a first dielectric layer overlying the copper interconnect structure (Step 218), which has been annealed. The first dielectric layer is provided as an etch stop layer for a subsequent etching process in a specific embodiment. Depending on the embodiment, the etch stop layer can be silicon nitride or silicon carbonitride (SiCN) and allows for etching and/or planarizing of a low k dielectric material. In a specific embodiment, the etch stop layer may be deposited at about the same temperature as the annealing process, for example at about 300 degree Celsius to about 380 degree Celsius and preferably between 330 degree Celsius to about 360 degree Celsius. Of course there can be other variations, modifications, and alternatives.

The method continues to perform other steps (Step 220) to complete the integrated circuit devices. These other steps can include deposition of one or more interlayer dielectric layers, usually formed from a low k dielectric material overlying the etch step layer, planarization, deposition of another level of interlayer dielectric layer, and other back end processes. The method ends with a stop step (Step 222). Of course one skilled in the art would recognize other variations, modifications, and alternatives.

FIGS. 3-6 are simplified diagrams illustrating a method of forming a copper interconnect structure according to an embodiment of the present invention. As shown, a semiconductor substrate 302 is provided. In a specific embodiment, the semiconductor substrate can be a silicon material including single crystal silicon, silicon on insulator (commonly known as SOI), silicon germanium, or other suitable semiconductor materials. In a specific embodiment, the semiconductor substrate includes one or more devices formed thereon.

In a specific embodiment, the method includes forming a dielectric layer 404 overlying the semiconductor substrate 402 as shown in FIG. 4. A copper interconnect structure 405 is formed in a portion of the dielectric layer. The dielectric layer is formed from a low k dielectric material in a specific embodiment. The low k dielectric material can include but not limited to silicon oxide material doped with carbon, phosphorus, boron, a combination of these, or a multilayer material depending on the application. Other low k dielectric materials may also include porous silicon oxide materials and others. The copper interconnect structure is usually formed overlying a barrier layer 406 to prevent diffusion of copper material into the dielectric layer. In a specific embodiment, the barrier layer can be a Ta/TaN, Ti/TiN or other suitable barrier material depending on the embodiment. In some embodiments, the barrier layer can be a suitable dielectric material such as silicon oxide, or silicon nitride or silicon oxynitride or a multilayer stack of dielectric materials (for example oxide on nitride on oxide (ONO) stack). The copper contact structure is formed using a damascene process or a dual damascene process. Copper is usually deposited using technique such as chemical vapor deposition, plating (electroplating or electroless plating), and a combination thereof. In a specific embodiment, a chemical mechanical polishing (CMP) process is performed to isolate the copper interconnect structure and to planarize a surface region. In a specific embodiment, the copper interconnect structure comprises a first stress characteristic. The first stress characteristic may be a result of thermal history or a mechanical stress due to thermal expansion incompatibility. In a specific embodiment, the first stress characteristic causes defects such as copper hillocks 408, delamination and the like. Copper hillock defects appear as bumps 412 and are detected after a subsequent deposition of a first dielectric layer 410 as illustrated in FIG. 1B.

In a specific embodiment, the method includes providing a deposition chamber (not shown). The deposition chamber can be a chemical vapor deposition (CVD) chamber including a plasma enhanced chemical vapor deposition (PECVD) chamber in a specific embodiment. The method includes loading the semiconductor substrate including the copper interconnect structure into the deposition chamber. The method includes providing an inert environment in the deposition chamber and performing an anneal process 502 on the semiconductor substrate including the copper interconnect structure. The inert environment is provided using nitrogen or an inert gas such as helium, argon, and others. In a specific embodiment, the anneal process is performed at a temperature ranging from about 300 degree Celsius to about 380 degree Celsius and for a time period ranging from about 30 seconds to about 200 seconds in the inert environment. In a specific embodiment, the anneal process is carried out at a pressure ranging from about 2 Torr to about 10 Torr. The pressure is maintained using, for example, Ar at a flow rate of about 2000 SCCM for a pressure of about 5 Torr in a specific embodiment. Of course there can be other variations, modifications, and alternatives.

Referring to FIG. 6, the method maintains the semiconductor substrate in the deposition chamber after the anneal process. In a specific embodiment, the method includes depositing a first dielectric layer 602 overlying the copper interconnect structure, which has been annealed in a specific embodiment. The first dielectric layer is provided as an etch stop layer for a subsequent etching process in a specific embodiment. Depending on the embodiment, the etch stop layer can be silicon nitride or silicon carbonitride (SiCN) and allows for etching and/or planarizing of a second low k dielectric material. In a specific embodiment the etch stop layer may be deposited at about the same temperature as the annealing process, for example at about 300 degree Celsius to about 380 degree Celsius and preferably between 330 degree Celsius to about 360 degree Celsius. Of course there can be other variations, modifications, and alternatives.

The method continues to perform other steps to complete the integrated circuit devices. These other steps can include deposition of one or more interlayer dielectric layers, usually formed from a low k dielectric material overlying the etch step layer, planarization, deposition of other metal layers, and other back end processes. The low k dielectric layer may include silicon oxide, doped silicon oxide, organo silicon oxide, carbon doped silicon oxide such as Black Diamond™ from Applied Materials, nitrogen doped carbide (NDC). Of course, one skilled in the art would recognize other variations, modifications, and alternatives.

FIGS. 7-10 illustrate experimental results using the present method for reducing copper hillocks according to embodiments of the present invention. These diagrams are merely examples and should not unduly limit the claims herein. One skilled in the art would recognize other variations, modifications, and alternatives.

Figure 7:
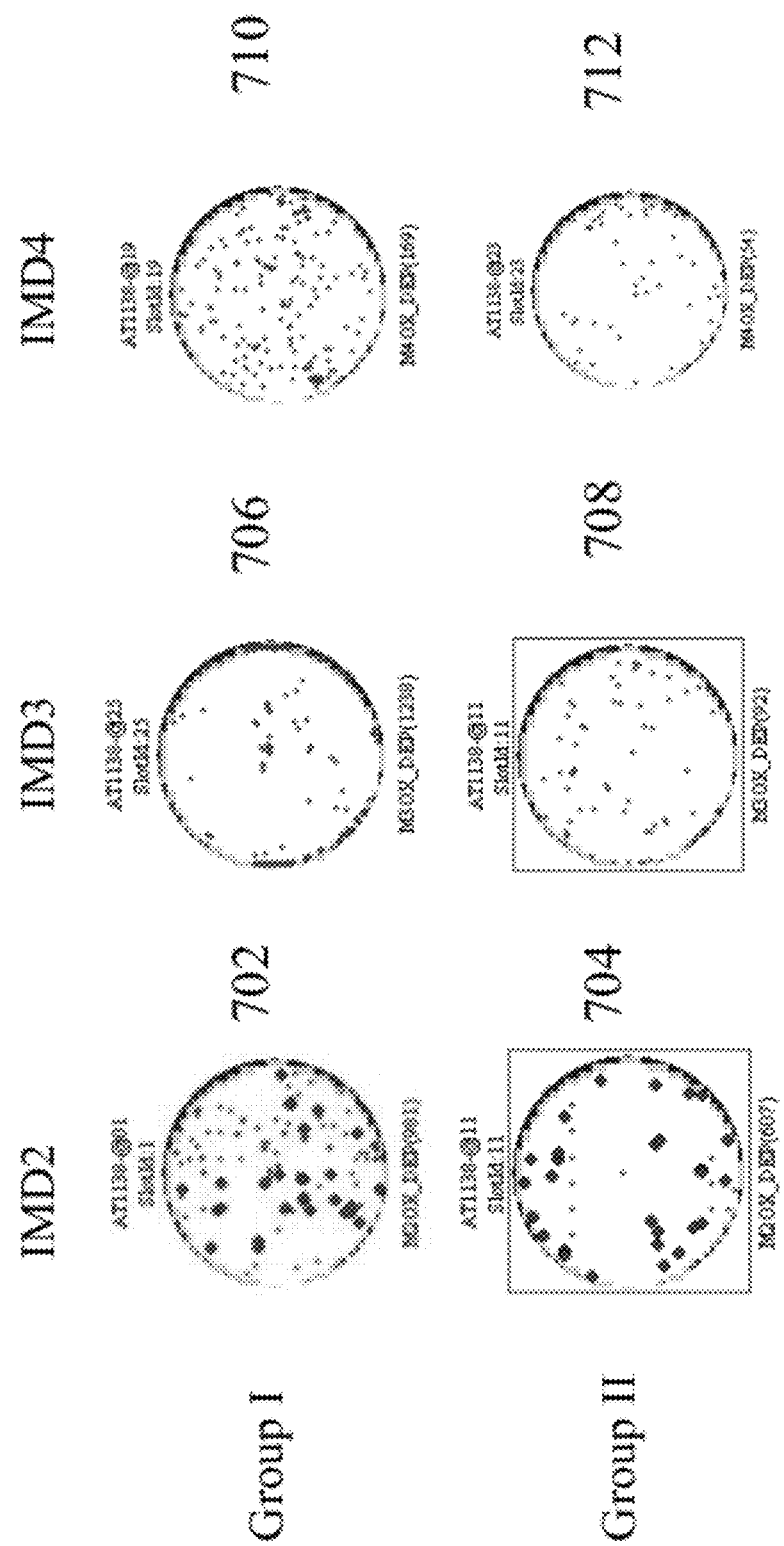
FIGS. 7-10 are simplified diagrams illustrating experimental results according to embodiments of the present invention

As shown in FIG. 7, inspection results for wafers with and without anneal treatment are provided. Results in Group I were from wafers without the anneal treatment and results in Group II were wafers that had been subjected to an anneal treatment from a same lot. The anneal treatment is carried out under the following condition:

Anneal time: 110 seconds
Pressure: 5 Torr
Ar flow rate 2000 SCCM
Anneal Temperature: 350 degree Celsius
Pump time: 10 seconds.

These inspection results were obtained after deposition of inter metal layer dielectric nitrogen doped carbide (NDC). Defect map 702 illustrates inspection result obtained from intermetal dielectric (IMD) level 2 without the anneal step. Defect map 704 illustrates inspection results obtained from the same lot but had subjected to the anneal process. The number of hillock defects decreased from 152 to 43. Similar results are obtained from IMD level 3 and level 4. Defect map 706 illustrates inspection result obtained from intermetal dielectric (IMD) level 3 without the anneal step. Defect map 708 illustrates inspection results obtained from the same lot but has subjected to the anneal process. The number of hillock defects decreases from 118 to 65. Defect map 710 illustrates inspection result obtained from intermetal dielectric (IMD) level 4 without the anneal step. Defect map 712 illustrates inspection results obtained from the same lot but had subjected to the anneal process. The number of hillock defects decreased from 157 to 52.

Figure 8:
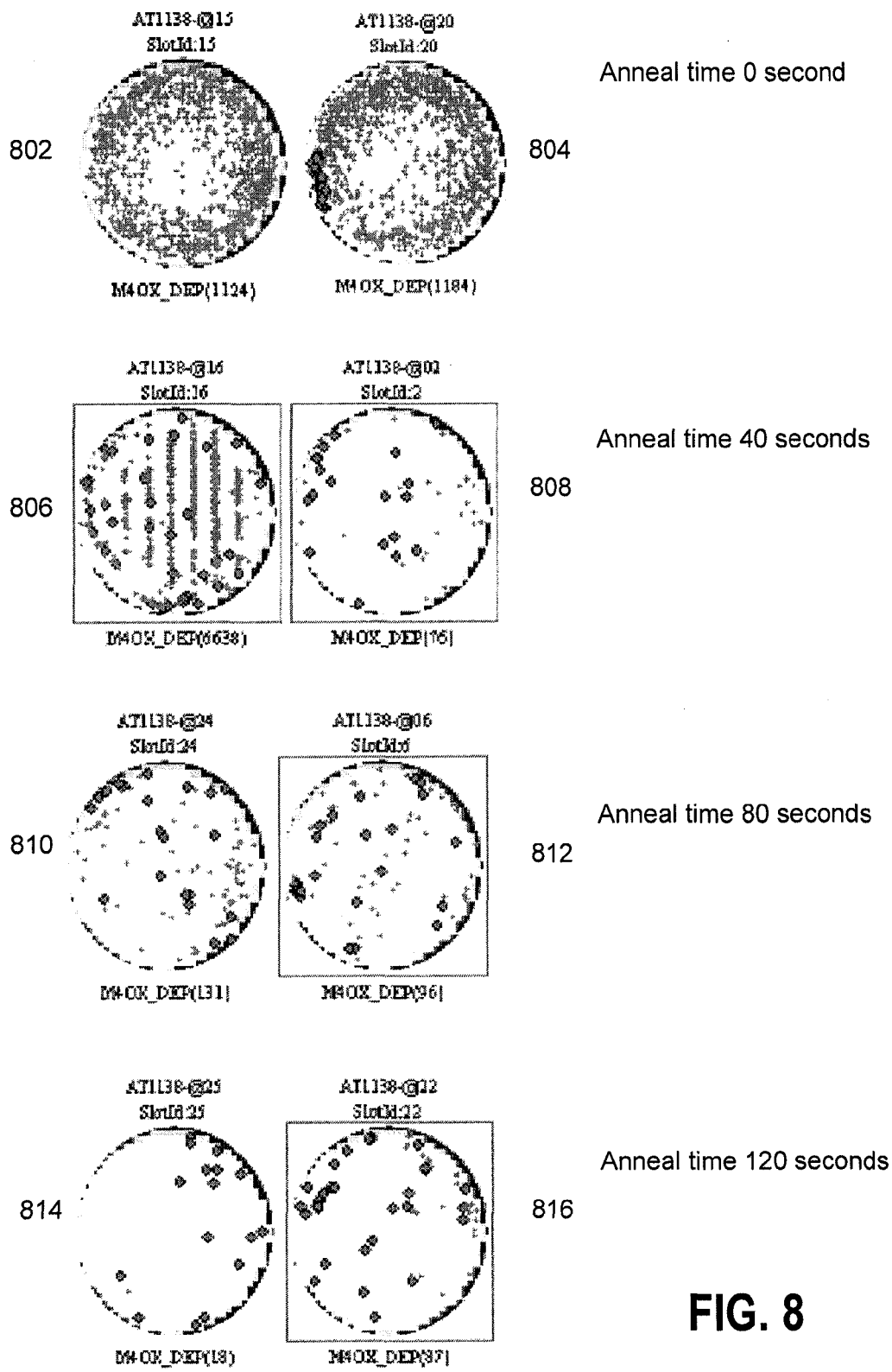

FIG. 8 illustrates the effect of anneal time on the hillock defects according to an embodiment of the present invention. These defect maps were obtained after deposition of intermetal layer using low k dielectric material nitrogen doped carbide (NDC). As shown, defect maps 802 and 804 were obtained from wafers without annealing. The number of hillock defects are 1045 and 1073 respectively. Defect maps 806 and 808 were measured on wafers that had been subjected to the anneal process for 40 seconds. The number of hillock defects decreased. Defect maps 810 and 812 were measured for wafers that were annealed for 80 seconds. The number of hillocks was 119 and 84 respectively. Similarly, defect maps were obtained from wafers that had been subjected to an anneal time of 120 seconds. The defect counts were 17 and 66 respectively.

Figure 9:
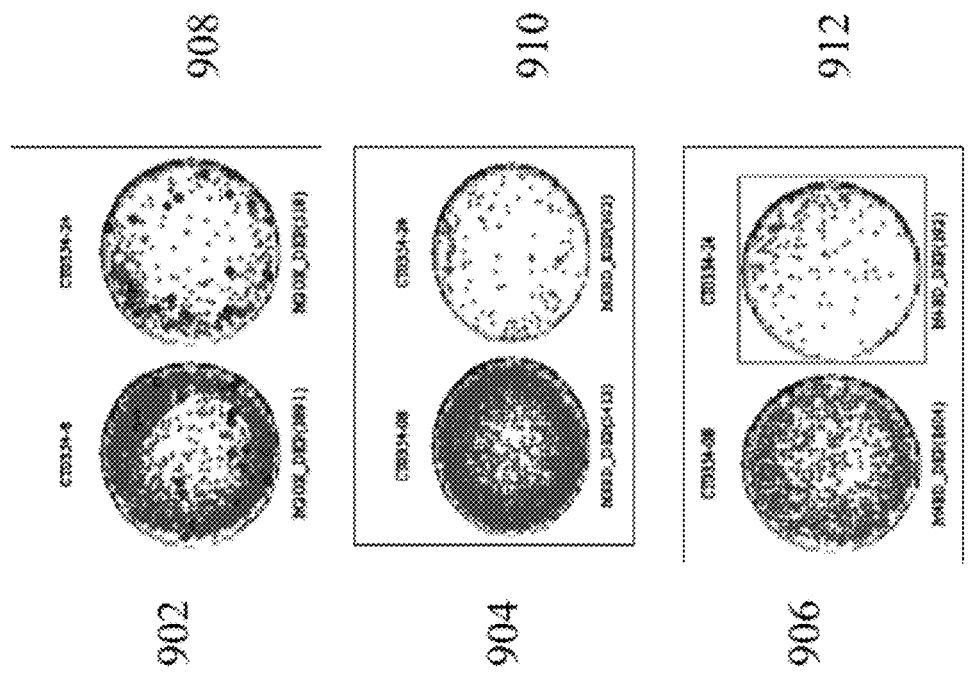

FIG. 9 is another example illustrating the effect of annealing on hillock defects according to an embodiment of the present invention. As shown, wafer #8 was not subjected to the anneal process. The defect maps of wafer #8 after IMD2, IMD3 and IMD4 deposition are given in 902, 904, and 906. Wafer #24 was annealed for 40 seconds. The defect maps measured after IMD2, IMD3, and IMD4 deposition are shown in 908, 910, and 912. As shown, the number of hillock defects were significantly reduced for wafer #24 for the respective IMD layers, which had undergone the anneal treatment.

Figure 10:
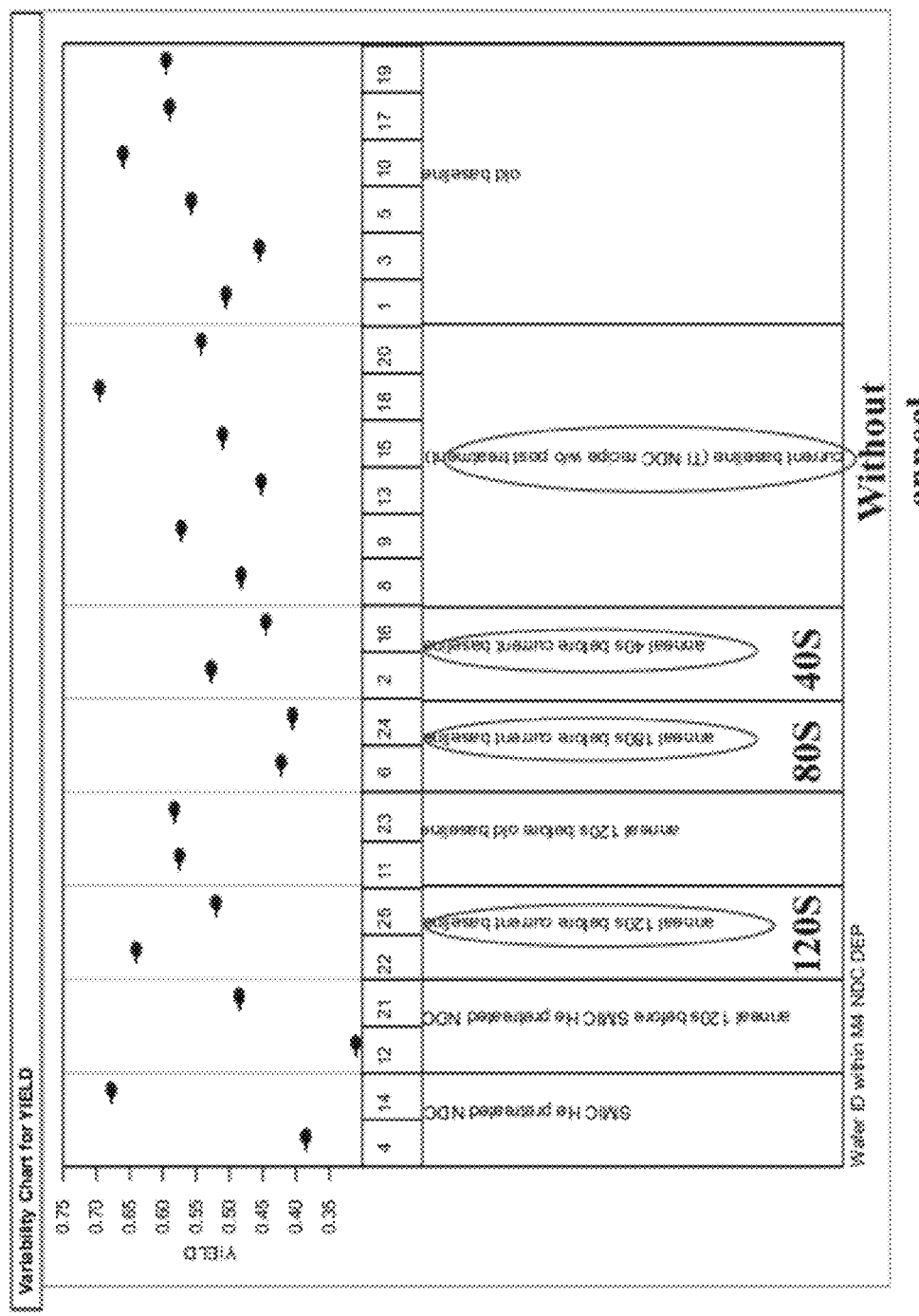

FIG. 10 is a simplified plot illustrating device yield as a result of annealing according to an embodiment of the present invention. As shown, the anneal process does not have a significant impact on yield, which is within a variation of yield baseline and within the baseline yield. Of course one skilled in the art would recognize other variations, modifications, and alternatives.

It is also understood that the examples and embodiments described herein are for illustrative purposes only and that various modifications or changes in light thereof will be suggested to persons skilled in the art. For example, the copper interconnect structure may be the first metal layer or the second metal layer or the third metal layer or the fourth metal layer or others, depending on the embodiment. Therefore these and other variations, modifications, and alternatives are to be included within the spirit and purview of this application and scope of the appended claims.

What is claimed is:

1. A method of forming interconnects in integrated circuits (IC), comprising:
    providing a semiconductor substrate having one or more IC devices formed thereon;
    forming a copper interconnect structure, the copper interconnect structure being formed overlying an oxide on nitride on oxide barrier layer within a thickness of an interlayer dielectric layer, the copper interconnect structure having a first stress characteristic;
    loading the semiconductor substrate including the copper interconnect structure into a deposition chamber;
    providing an inert environment within the deposition chamber;
    subjecting the semiconductor substrate including the copper interconnect structure to an anneal process in the inert environment for a period of time to cause the copper interconnect structure to have reduced copper hillock defects;
    maintaining the semiconductor substrate in the deposition chamber; and
    depositing an etch stop layer overlying the copper interconnect structure; and
    depositing an inter-metal dielectric layer overlying the etch stop layer,
    wherein the anneal process is characterized by:
    a pressure ranging from about 2 Torr to about 10 Torr;
    a temperature ranging from about 320 degree Celsius to about 360 degree Celsius; and
    the period of time ranging from about 30 seconds to about 200 seconds.

2. The method of claim 1, wherein the inter-metal dielectric layer is a low k dielectric material.

3. The method of claim 1, wherein the inter-metal dielectric layer comprises silicon oxide, doped silicon oxide, organo silicon oxide, carbon doped silicon oxide, or nitrogen doped carbide (NDC).

4. The method of claim 1, wherein the inert environment is provided by nitrogen, argon, helium, or a combination thereof.

5. The method of claim 1, wherein the deposition chamber is a chemical vapor deposition chamber.

6. The method of claim 5, wherein the deposition chamber is a plasma enhanced chemical vapor deposition chamber.

7. The method of claim 1, wherein the etch stop layer is deposited by a plasma enhanced chemical vapor deposition process.

8. The method of claim 1, wherein the etch stop layer is deposited at a temperature within a range of the temperature of the anneal process.

9. The method of claim 1, wherein the first stress characteristic causes a plurality of copper hillock defects.

10. The method of claim 1, wherein the plurality of copper hillock defects is measured after deposition of the inter-metal dielectric layer.

11. The method of claim 1, wherein the etch stop layer comprises silicon nitride, silicon carbonitride (SiCN), or a combination thereof.

12. A method of forming interconnects in integrated circuits, comprising:
    providing a semiconductor substrate having one or more devices providing thereon;
    forming a copper interconnect structure, the copper interconnect structure being formed overlying an oxide on nitride on oxide barrier layer within a thickness of an interlayer dielectric layer, the copper interconnect structure comprising a first stress characteristic;

loading the semiconductor substrate including the copper interconnect structure into a deposition chamber;

providing an inert environment within the deposition chamber;

subjecting the semiconductor substrate including the copper interconnect structure to an anneal process in the inert environment for a period of time to cause the copper interconnect structure to have reduced copper hillock defects;

maintaining the semiconductor substrate in the deposition chamber;

depositing a dielectric layer overlying the copper interconnect structure; and depositing an inter-metal dielectric layer overlying the dielectric layer, wherein the anneal process is further characterized by:

a pressure ranging from about 2 Torr to about 10 Torr;

a temperature ranging from about 320 degree Celsius to about 360 degree Celsius; and the period of time ranging from about 30 seconds to about 200 seconds.

13. The method of claim 12, wherein the inter-metal dielectric layer comprises a low k dielectric material, the low k dielectric material is selected from the group: silicon oxide, doped silicon oxide, organo silicon oxide, carbon doped silicon oxide, and nitrogen doped carbide (NDC).

14. The method of claim 12, wherein the dielectric layer is an etch stop layer comprising silicon nitride, silicon carbonitride (SiCN), or a combination thereof and being deposited at a temperature within a range of the temperature of the anneal process.

15. The method of claim 12, wherein the copper hillock defects are measured after deposition of the inter-metal dielectric layer.

16. The method of claim 1, wherein the pressure is maintained using argon at a flow rate of about 2000 SCCM.

* * * * *